(12) United States Patent
Kim et al.

(10) Patent No.: US 8,837,246 B2
(45) Date of Patent: Sep. 16, 2014

(54) MEMORY DEVICE, OPERATION METHOD THEREOF AND MEMORY SYSTEM HAVING THE SAME

(71) Applicant: Samsung Electronics Co., Ltd., Suwon-si (KR)

(72) Inventors: Ki Heung Kim, Hwaseong-si (KR); In Chul Jeong, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/803,520

(22) Filed: Mar. 14, 2013

(65) Prior Publication Data

US 2013/0336079 A1    Dec. 19, 2013

(30) Foreign Application Priority Data

Jun. 14, 2012  (KR) .......................... 10-2012-0063916

(51) Int. Cl.
  *G11C 7/00*  (2006.01)
  *G11C 11/402*  (2006.01)
  *G11C 11/406*  (2006.01)

(52) U.S. Cl.
  CPC ........ *G11C 11/402* (2013.01); *G11C 11/40618* (2013.01)
  USPC ...................................... 365/222; 365/189.11

(58) Field of Classification Search
  USPC ............................. 365/222, 189.11
  See application file for complete search history.

(56) References Cited

U.S. PATENT DOCUMENTS

| 5,627,791 A | 5/1997 | Wright et al. |
| 2003/0218930 A1 | 11/2003 | Lehmann et al. |
| 2010/0172200 A1* | 7/2010 | Kawakubo et al. ........... 365/222 |

FOREIGN PATENT DOCUMENTS

| JP | 200609987 | 4/2006 |
| JP | 2008165847 | 7/2008 |
| KR | 19950014089 | 11/1995 |
| KR | 1020030001710 | 1/2003 |

* cited by examiner

*Primary Examiner* — Hoai V Ho
*Assistant Examiner* — Muhammad Islam
(74) *Attorney, Agent, or Firm* — F. Chau & Associates, LLC

(57) ABSTRACT

A memory refresh method includes selecting at least one bank from among N banks of a memory device, and activating K word lines from among a plurality of word lines included in the at least one bank during one of L refresh cycles of a refresh period. Each of the N banks comprises M word lines, N, K and M are each a natural number greater than or equal to two, L is a natural number less than or equal to M, and K is equal to M*N/L.

20 Claims, 29 Drawing Sheets

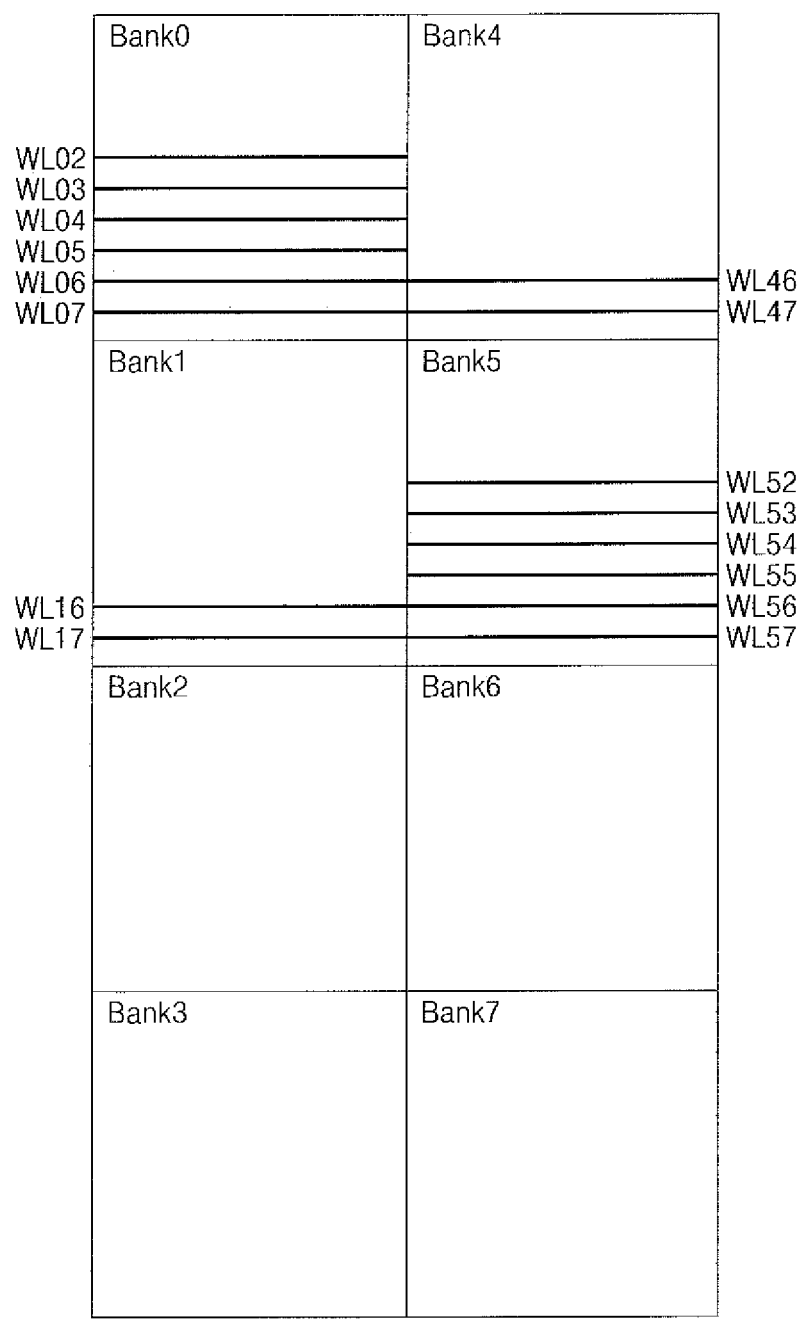

MEMORY DEVICE, OPERATION METHOD THEREOF AND MEMORY SYSTEM HAVING THE SAME

CROSS-REFERENCE TO RELATED APPLICATIONS

This application claims priority under 35 U.S.C. §119 to Korean Patent Application No. 10-2012-0063916, filed on Jun. 14, 2012, the disclosure of which is incorporated by reference herein in its entirety.

TECHNICAL FIELD

Exemplary embodiments of the present inventive concept relate to an operation method of a memory device, and more particularly, to a method of activating word lines included in banks of the memory device, and devices using the same.

DISCUSSION OF THE RELATED ART

A memory device may be used in an electronic device to store data. For example, the memory device may be a dynamic random access memory (DRAM) that includes a plurality of banks.

Each of the plurality of banks may include a plurality of word lines, a plurality of bit lines, and a plurality of memory cells for storing data.

A memory device may perform a refresh operation to prevent data stored in each of a plurality of memory cells included in the memory device from being lost, for example, as a result of memory leakage. In addition, the memory device may not perform a normal memory access operation (e.g., a read operation or a write operation) on a bank where a refresh operation is performed. A refresh operation may be periodically performed, and an interval of the refresh operation is related to data retention time of a memory cell.

SUMMARY

According to an exemplary embodiment of the present inventive concept, a memory refresh method includes selecting at least one bank from among N banks of a memory device, and activating K word line from among a plurality of word lines included in the at least one bank during one of L refresh cycles of a refresh period. Each of the N banks comprises M word lines, N, K and M are each a natural number greater than or equal to two, L is a natural number less than or equal to M, and K is equal to M*N/L.

According to an exemplary embodiment, selecting the at least one bank may include selecting at least two banks from among the N banks that may be activated, and activating the K word lines may include activating a different number of word lines included in each of the at least two banks.

According to an exemplary embodiment, activating the K word lines may include activating the K word lines in response to an auto-refresh command.

According to an exemplary embodiment, after activating the K word lines, refreshing K word lines from among word lines included in unselected banks from among the N banks may be further included.

According to an exemplary embodiment, activating the K word lines may include performing a normal memory access operation on each of unselected banks from among the N banks during the one refresh cycle.

According to an exemplary embodiment, the N banks may include a first bank, a second bank, a third bank, and a fourth bank, during a first refresh cycle of the L refresh cycles, a same number of word lines may be activated in the first and second banks and no word lines may be activated in the third and fourth banks, and during a second refresh cycle of the L refresh cycles, the same number of word lines may be activated in the third and fourth banks and no word lines may be activated in the first and second banks.

According to an exemplary embodiment, the N banks may include a first bank, a second bank, a third bank, a fourth bank, a fifth bank, a sixth bank, a seventh bank, and an eighth bank, during a first refresh cycle of the L refresh cycles, a first number of word lines may be activated in the first and sixth banks, a second number of word lines, different from the first number of word lines, may be activated in the second and fifth banks, and no word lines may be activated in the third, fourth, seventh, and eighth banks, during a second refresh cycle of the L refresh cycles, the first number of word lines may be activated in the second and fifth banks, the second number of word lines may be activated in the first and sixth banks, and no word lines may be activated in the third, fourth, seventh, and eighth banks, during a third refresh cycle of the L refresh cycles, the first number of word lines may be activated in the third and eighth banks, the second number of word lines may be activated in the fourth and seventh banks, and no word lines may be activated in the first, second, fifth, and sixth banks, and during a fourth refresh cycle of the L refresh cycles, the first number of word lines may be activated in the fourth and seventh banks, the second number of word lines may be activated in the third and eighth banks, and no word lines may be activated in the first, second, fifth, and sixth banks.

According to an exemplary embodiment, the N banks may include a first bank, a second bank, and a third bank, during a first refresh cycle of the L refresh cycles, a first number of word lines may be activated in the first bank and no word lines may be activated in the second and third banks, during a second refresh cycle of the L refresh cycles, the first number of word lines may be activated in the second bank and no word lines may be activated in the first and third banks, and during a third refresh cycle of the L refresh cycles, the first number of word lines may be activated in the third bank and no word lines may be activated in the first and second banks.

According to an exemplary embodiment, the N banks may include a first bank, a second bank, and a third bank, during a first refresh cycle of the L refresh cycles, a first number of word lines may be activated in the first bank, a second number of word lines, different from the first number of word lines, may be activated in the second bank, and no word lines may be activated in the third bank, and during a second refresh cycle of the L refresh cycles, the first number of word lines may be activated in the third bank, the second number of word lines may be activated in the second bank, and no word lines may be activated in the first bank.

According to an exemplary embodiment of the present inventive concept, a memory refresh method includes selecting at least one bank from among a plurality of banks of a memory device, activating at least two word lines from among a plurality of word lines included in the at least one bank during one refresh cycle of a refresh period, and performing a normal memory access operation on each of a plurality of unselected banks from among the plurality of banks during a refresh operation of the at least one selected bank.

According to an exemplary embodiment of the present inventive concept, a memory device includes N banks, wherein each of the N banks comprises M word lines, and a control circuit configured to select at least one bank from among the N banks in response to a refresh command set, and activate K word lines from among a plurality of word lines included in the at least one bank during one of L refresh cycles of a refresh period. N, K and M are each a natural number greater than or equal to two, L is a natural number less than or equal to M, and K is equal to M*N/L.

According to an exemplary embodiment, the refresh command set may be a command set for performing an auto-refresh operation.

According to an exemplary embodiment, the memory device may be a dynamic random access memory (DRAM).

An exemplar embodiment, a memory system may include the memory device and a memory controller configured to output the refresh command set.

According to an exemplary embodiment, the refresh command set may be a command set for performing an auto-refresh operation.

BRIEF DESCRIPTION OF THE DRAWINGS

The above and other features of the present invention will become more apparent by describing in detail exemplary embodiments thereof with reference to the accompanying drawings, in which:

FIG. 7B illustrates a second refresh cycle of the plurality of banks illustrated in FIG. 7A, according to an exemplary embodiment of the present inventive concept.

DETAILED DESCRIPTION OF THE EXEMPLARY EMBODIMENTS

Figure 1:
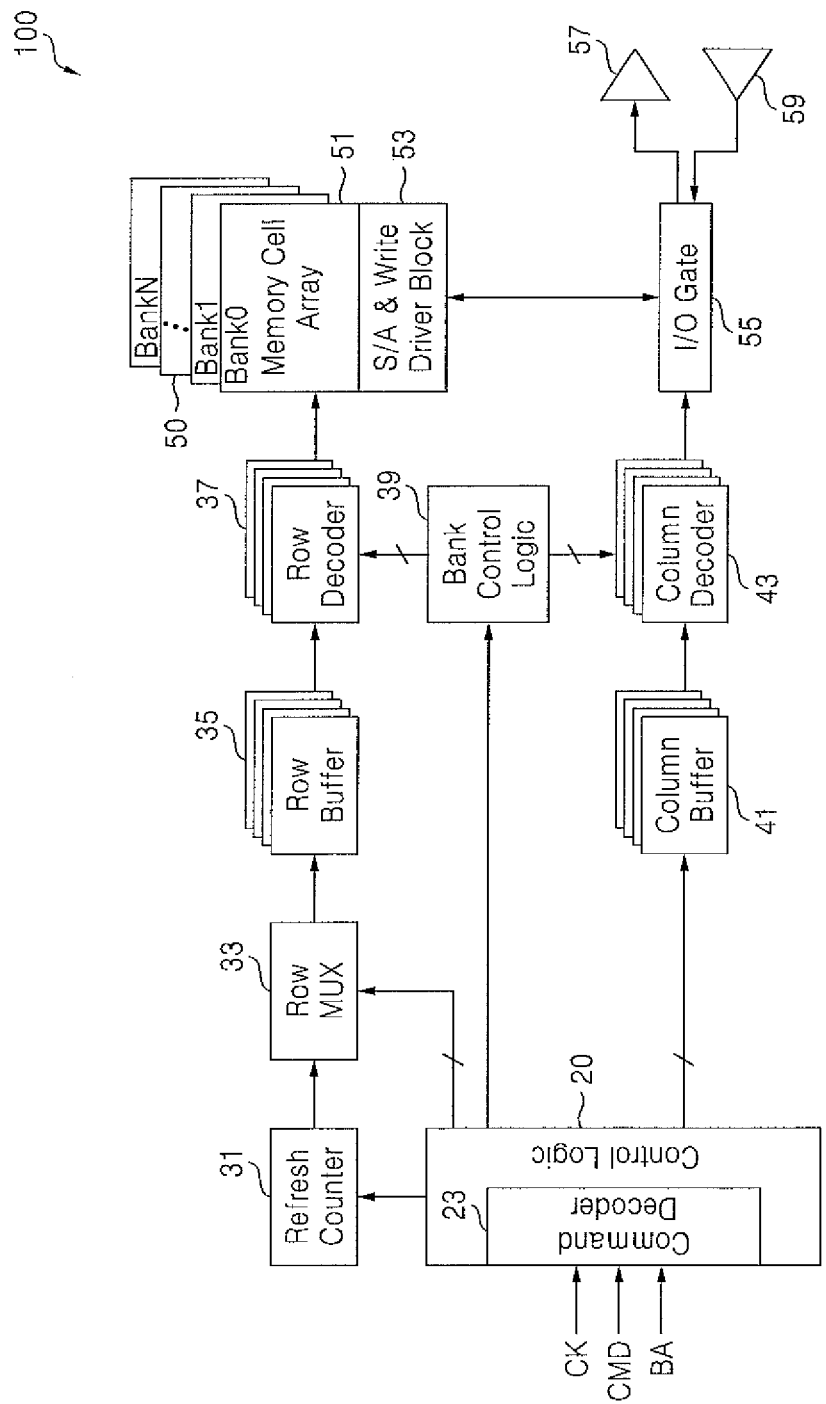
FIG. 1 is a block diagram of a memory device, according to an exemplary embodiment of the present inventive concept.

Exemplary embodiments of the present invention will be described more fully hereinafter with reference to the accompanying drawings. Like reference numerals may refer to like elements throughout the accompanying drawings.

The term "command set" used herein may include a command and/or an address.

FIG. 1 is a block diagram of a memory device according to an exemplary embodiment of the present inventive concept. Referring to FIG. 1, a memory device 100 may be embodied as a dynamic random access memory (DRAM), however, the memory device 100 is not limited thereto.

The memory device 100 may include a control logic 20, a refresh counter 31, a row multiplexer 33, a plurality of row buffers 35, a plurality of row decoders 37, a bank control logic 39, a plurality of column buffers 41, a plurality of column decoders 43, a plurality of banks 50, an input/output gate 55, an output driver 57, and an input buffer 59.

The control logic 20 may control each configuration element including, for example, the refresh counter 31, the row multiplexer 33, the bank control logic 39, and/or the plurality of column buffers 41. The configuration elements may be controlled in response to a plurality of signals including, for example, a clock signal CK, a command signal CMD, and/or a bank address signal BA.

The command signal CMD may refer to a combination of a plurality of commands including, for example, a CS signal, a RAS signal, a CAS signal, and/or a WE signal. According to an exemplary embodiment, the command signal CMD may be transmitted from a memory controller.

The bank address signal BA may include address information of a bank that is an object of a refresh operation. According to an exemplary embodiment, the bank address signal BA may be generated inside the memory device 100, however, exemplary embodiments are not limited thereto. For example, according to an exemplary embodiment, the bank address signal BA may be input from outside the memory device 100.

The control logic 20 may include a command decoder 23, however, the location of the command decoder 23 is not limited thereto. For example, according to an exemplary embodiment, the command decoder 23 may disposed separate from the control logic 20.

The command decoder 23 may decode the command signal CMD, which may include at least one of a plurality of commands as described above (e.g., a CS command, an RAS command, a CAS command, and/or a WE command) based on a clock signal CK, and may generate a command and/or an address for controlling each configuration element (e.g., the refresh counter 31, the row multiplexer 33, the bank control logic 39 and/or the plurality of column buffers 41) according to a decoding result. According to an exemplary embodiment, the command decoder 23 may decode a command signal CMD and generate a refresh command (e.g., an auto-refresh command) for performing a refresh operation.

The refresh counter 31 may generate a row address in response to a refresh command output from the command decoder 21

The row multiplexer 33 may select a row address generated by the refresh counter 31, and a row address output from the control logic 20 in response to a selection signal. According to an exemplary embodiment, the row multiplexer 33 may select the row address generated by the refresh counter 31 during a refresh operation. According to an exemplary embodiment, the row multiplexer 33 may select the row address output from the control logic 20 during a normal memory access operation (e.g., a read operation or a write operation).

Each of the plurality of row buffers 35 may buffer a row address output from the row multiplexer 33. According to an exemplary embodiment, the plurality of row buffers 35 may be embodied as a single row buffer.

A row decoder from among the plurality of row decoders 37 corresponding to a bank selected by the bank control logic 39 may decode a row address output from a row buffer from among the plurality of row buffers 35 corresponding to the selected bank. According to an exemplary embodiment, the plurality of row decoders 37 may be embodied as a single row decoder. According to an exemplary embodiment, each of the plurality of row decoders 37 may activate additional word lines during a one-time refresh cycle, and may treat a specific bit(s) of a received row address as a don't care bit.

The bank control logic 39 may select banks from among the plurality of banks 50 for performing a refresh operation under control of the control logic 20. According to an exemplary embodiment, the control logic 20 may select banks from among the plurality of banks 50 for performing a refresh operation.

Each of a plurality of column buffers 41 may buffer a column address output from the control logic 20. According to an exemplary embodiment, the plurality of column buffers 41 may be embodied as a single column buffer.

A column decoder from among the plurality of column decoders 43 corresponding to a bank selected by the bank control logic 39 may decode a column address output from a column buffer from among the plurality of column buffers 41 corresponding to the selected bank. According to an exemplary embodiment, the plurality of column decoders 43 may be embodied as a single column decoder.

Each of the plurality of banks 50 may include a memory cell array 51 (e.g., Bank0 through BankN), and a sense amplifiers & write driver block 53.

Each of the plurality of banks 50 is illustrated as being embodied on a different layer, however, the configuration and arrangement of the plurality of banks 50 are not limited thereto.

The memory cell array 51 may include a plurality of word lines (e.g., row lines), a plurality of bit lines (e.g., column lines), and a plurality of memory cells for storing data.

The sense amplifiers & write driver block 53 may operate as a sense amplifier sensing and amplifying a voltage change of each bit line when the memory device 100 performs a read operation. The sense amplifiers & write driver block 53 may further operate as a write driver driving each of a plurality of bit lines included in the memory cell array 51 when the memory device 100 performs a write operation.

An input/output gate 55 may transmit data or signals output from the sense amplifiers & write driver block 53 to an output driver 57 in response to a column selection signal output from one of the plurality of column decoders 43. According to an exemplary embodiment, the input/output gate 55 may transmit data or signals input through the input buffer 59 to the sense amplifiers & write driver block 53 in response to the column selection signal.

The output driver 57 may output data or signals transmitted from the input/output gate 55 to outside the memory device 100. The input buffer 59 may transmit data or signals input from outside the memory device 100 to the input/output gate 55.

Figure 2:
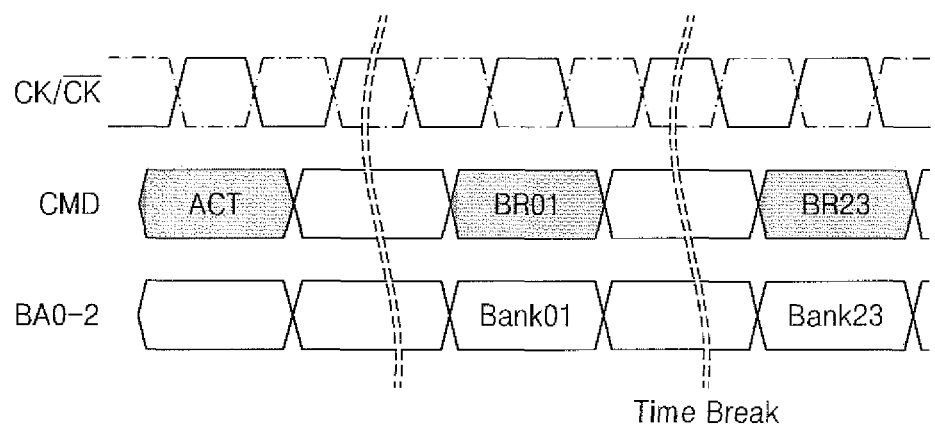
FIG. 2 is a timing diagram illustrating a refresh operation of the memory device illustrated in FIG. 1, according to an exemplary embodiment of the present inventive concept.
Figure 3:
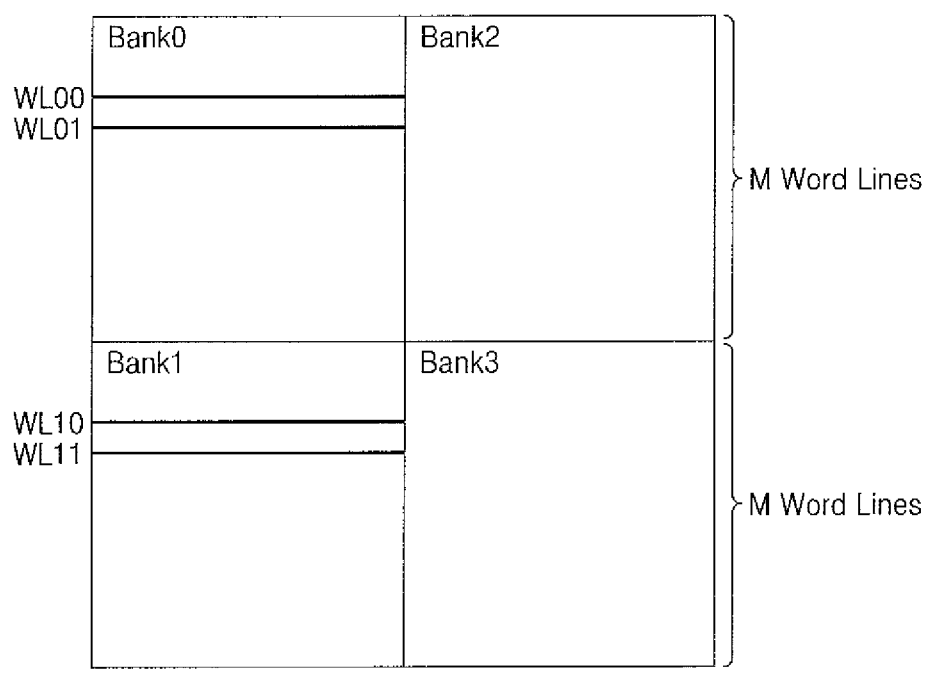
FIG. 3 illustrates a first refresh cycle of a refresh operation of a plurality of banks of the memory device illustrated in FIG. 1, according to an exemplary embodiment of the present inventive concept.
Figure 4:
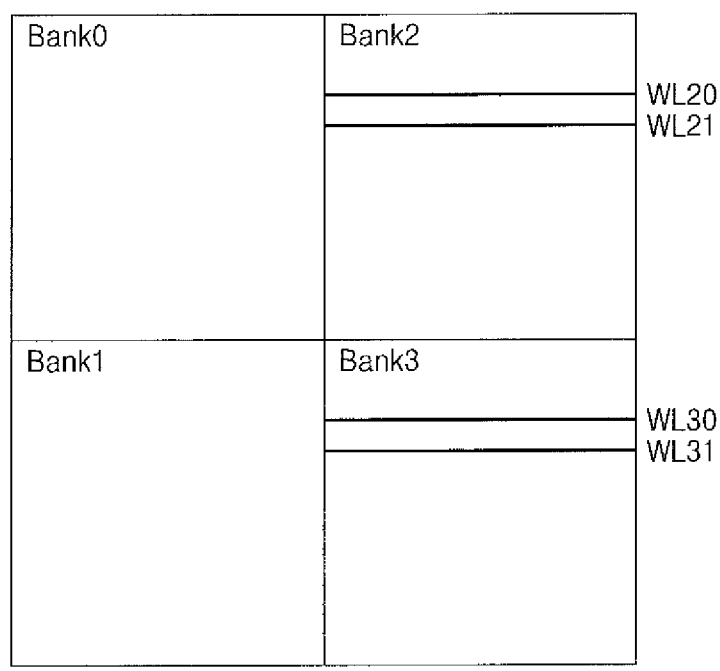
FIG. 4 illustrates a second refresh cycle of the plurality of banks illustrated in FIG. 3, according to an exemplary embodiment of the present inventive concept.

FIG. 2 is a timing diagram illustrating a refresh operation of the plurality of banks of the memory device illustrated in FIG. 1 according to an exemplary embodiment. FIG. 3 illustrates a first refresh cycle of a refresh operation according to an exemplary embodiment of the plurality of banks illustrated in FIG. 1. FIG. 4 illustrates a second refresh cycle of the plurality of banks illustrated in FIG. 3 according to an exemplary embodiment.

Referring to FIGS. 1 and 2, a command signal CMD may include an active command ACT for activating banks that are a target of a refresh operation, a refresh command BR01 for performing a refresh operation on a bank Bank0 and a bank Bank1, and a refresh command BR23 for performing a refresh operation on a bank Bank2 and a bank Bank3.

A bank address Bank01 may include address information of the bank Bank0 and the bank Bank1, and a bank address Bank23 may include address information of the bank Bank2 and the bank Bank3. The memory device 100 may perform a refresh operation on a plurality of banks 50 based on a clock signal CK, a command signal CMD and a bank address signal BA.

FIGS. 3 through 6 refer to exemplary embodiments including four banks, however, the number of banks is not limited thereto. Each of the plurality of banks 50 may include M word lines, where M is a natural number greater than or equal to two.

Referring to FIG. 3, word lines WL00, WL01, WL10 and WL11 included in banks Bank0 and Bank1 selected from among the plurality of banks 50 may be activated based on a refresh command BR01.

Referring to FIG. 4, word lines WL20, WL21, WL30 and WL31 included in each of banks Bank2 and Bank3 selected from among the plurality of banks 50 may be activated based on a refresh command BR23. Each of the plurality of banks 50 may include 1,000 word lines (e.g., M=1,000), however the number of word lines is not limited thereto.

When M=1,000, a total of 1,000 refresh cycles are required to perform a refresh operation on every word line included in each of the plurality of banks 50 during a refresh period. When a refresh period is assumed to be 64 ms, a periodic refresh interval time is 64 μs. The refresh cycle may refer to a refresh operation performed corresponding to each refresh command, and the periodic refresh interval time may refer to the time taken to perform a refresh cycle one time.

Figure 5:
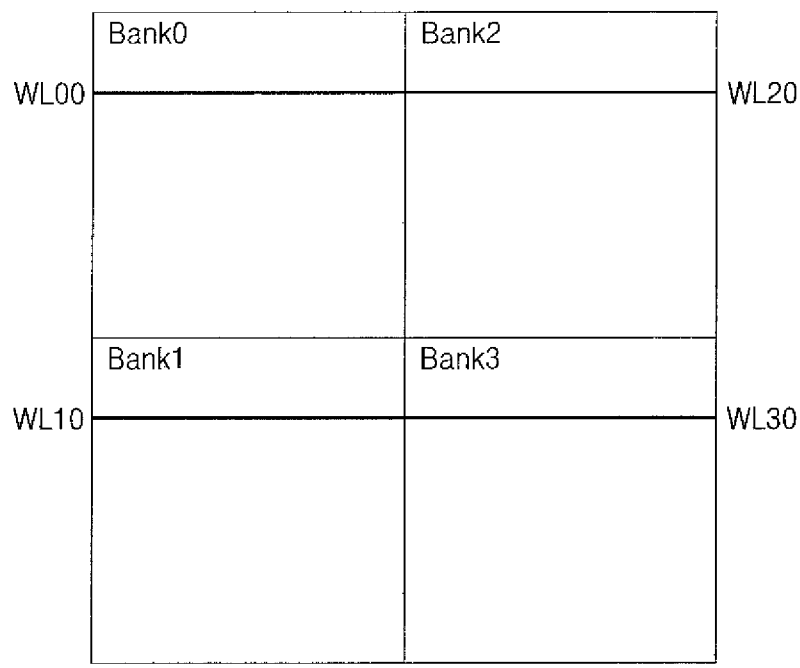
FIGS. 5 and 6 illustrate first and second refresh cycles of a refresh operation of a plurality of banks different from the refresh operation illustrated in FIGS. 3 and 4, according to an exemplary embodiment of the present inventive concept.
Figure 6:
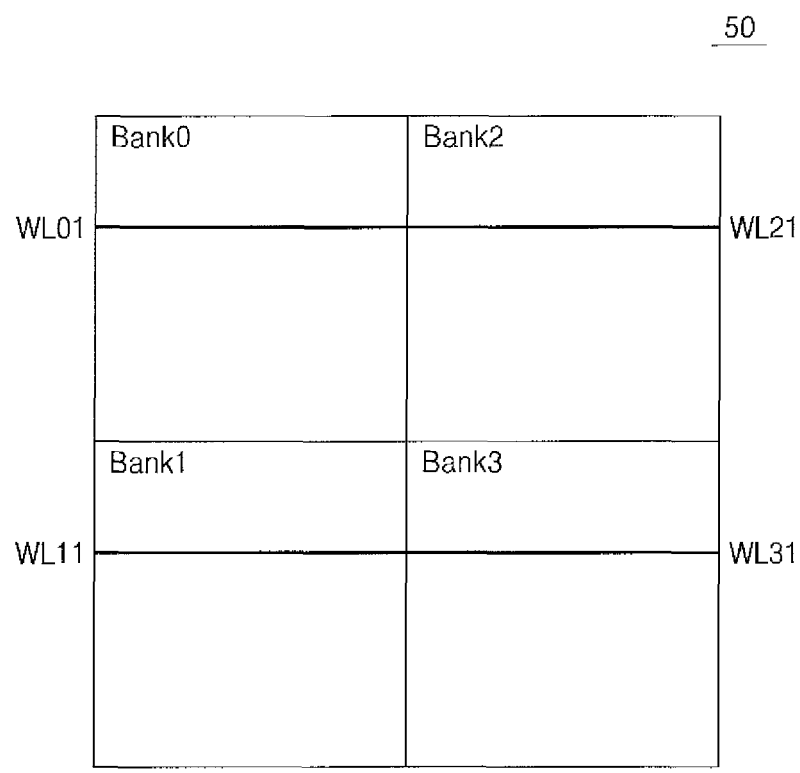

FIGS. 5 and 6 illustrate first and second refresh cycles of a refresh operation of a plurality of banks different from the refresh operation illustrated in FIGS. 3 and 4. Referring to FIG. 5, each of word lines WL00, WL10, WL20 and WL30 included in the plurality of banks 50 may be activated during a first refresh cycle.

Referring to FIG. 6, each of word lines WL01, WL11, WL21 and WL31 included in the plurality of banks 50 may be activated during a second refresh cycle.

Each of the plurality of banks 50 may have 1,000 word lines (e.g., M=1,000). When M=1,000, a total of 1,000 refresh cycles are required to perform a refresh operation on every word line included in each of the plurality of banks 50 during a refresh period. When a refresh period is assumed to be 64 ms, a periodic refresh interval time is 64 µs.

For example, a memory device 100 according to an exemplary embodiment of the present inventive concept may retain a periodic refresh interval time (e.g., 64 µs), and also perform a normal memory access operation on unselected banks (e.g., Bank2 and Bank3 of FIG. 3, or Bank0 and Bank1 of FIG. 4).

When the memory device 100 has N banks, where N is a natural number greater than or equal to two, each including M word lines, where M is a natural number greater than or equal to two, and L refresh cycles are performed during a refresh period, the number of activatable word lines included in the selected banks during a refresh cycle may be equal to M*N/L.

For example, when the memory device 100 has four banks (e.g., N=4) including 1,000 word lines (e.g., M=1,000), and 1,000 refresh cycles (e.g., L=1,000) are performed during a refresh period, a total of four word lines (e.g., M*N/L=1,000*4/1,000=4) included in the selected banks may be activated during a refresh cycle.

In FIG. 3, an identical number of word lines (e.g., two) is activated during a one-time refresh cycle at each of selected banks Bank0 and Bank1, however, the different number of word lines included in each of the selected banks activated according to exemplary embodiments is not limited thereto.

Figure 7A:
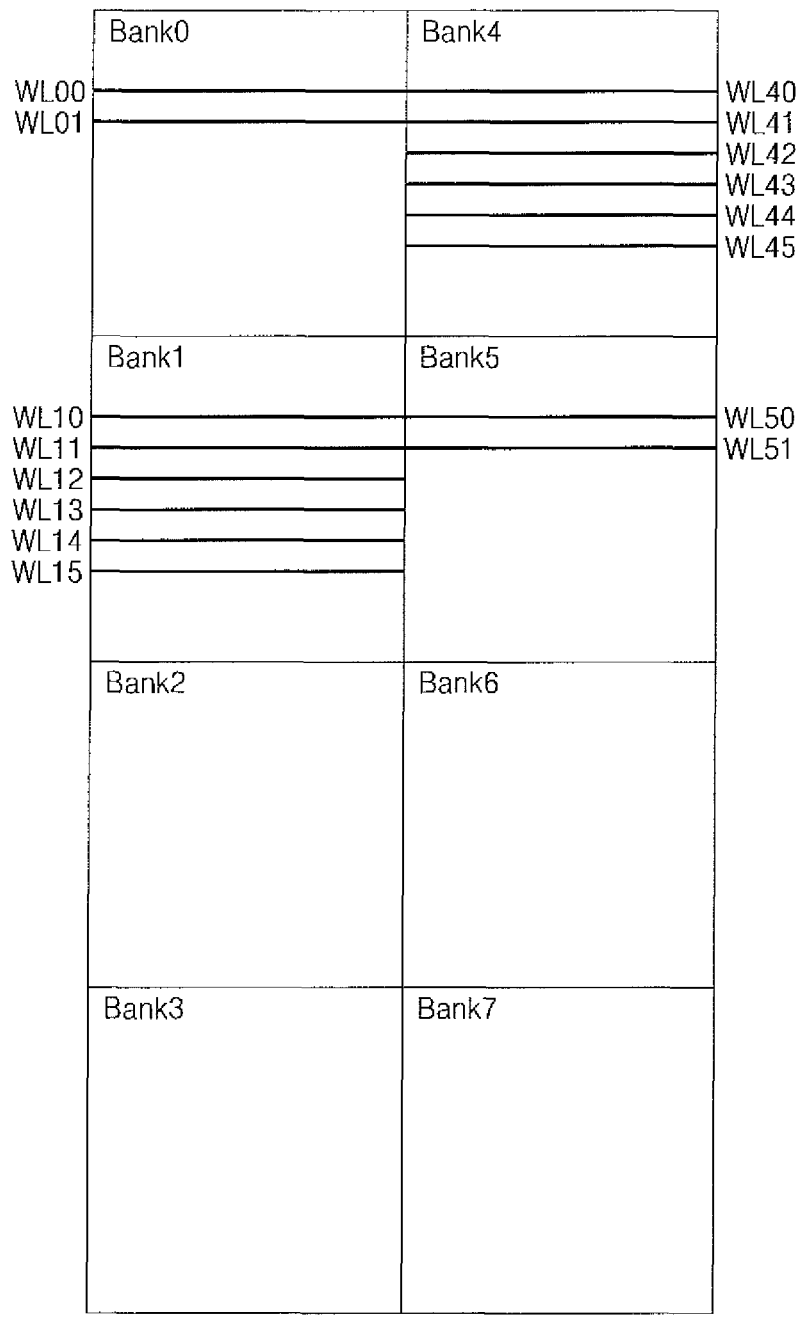
FIG. 7A illustrates a first refresh cycle of the refresh operation of the plurality of banks illustrated in FIG. 1, according to an exemplary embodiment of the present inventive concept.
Figure 7C:
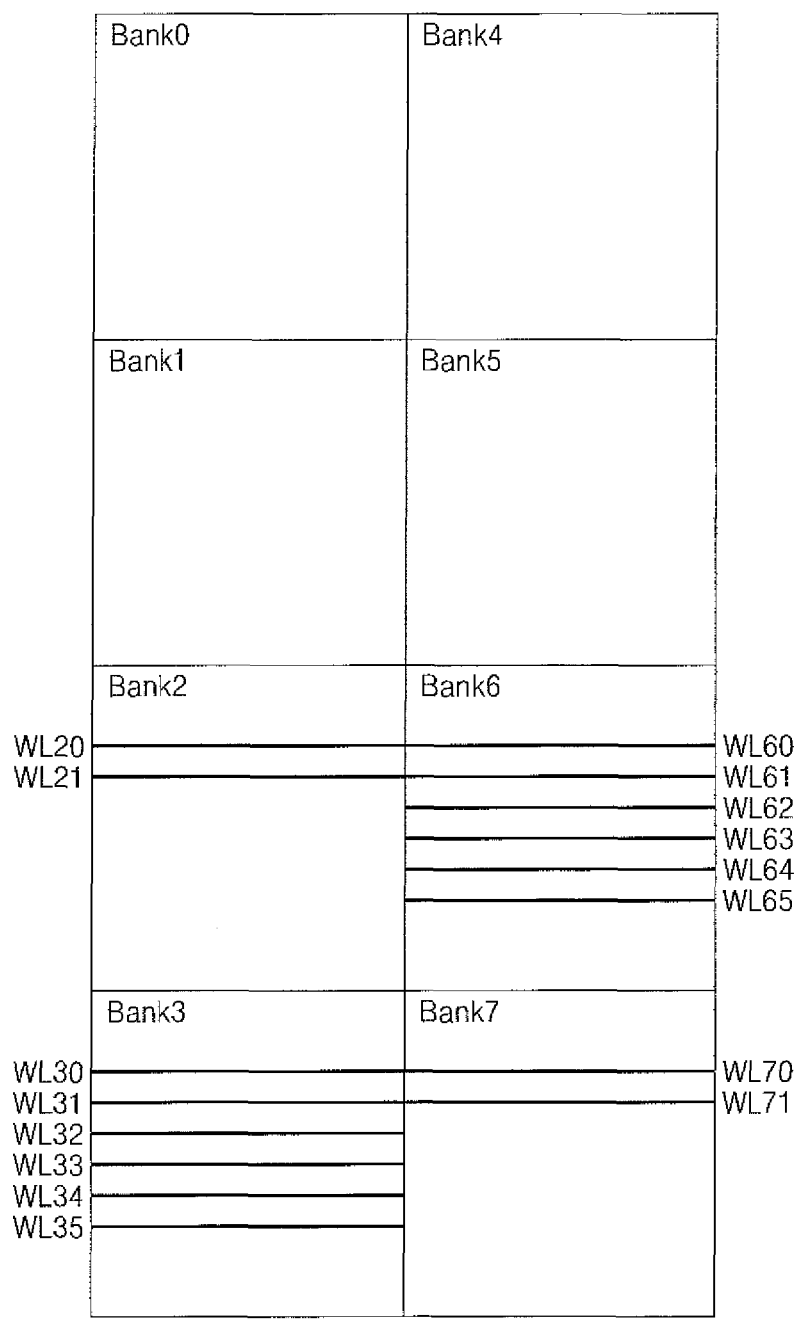
FIG. 7C illustrates a third refresh cycle of the plurality of banks illustrated in FIG. 7A, according to an exemplary embodiment of the present inventive concept.
Figure 7D:
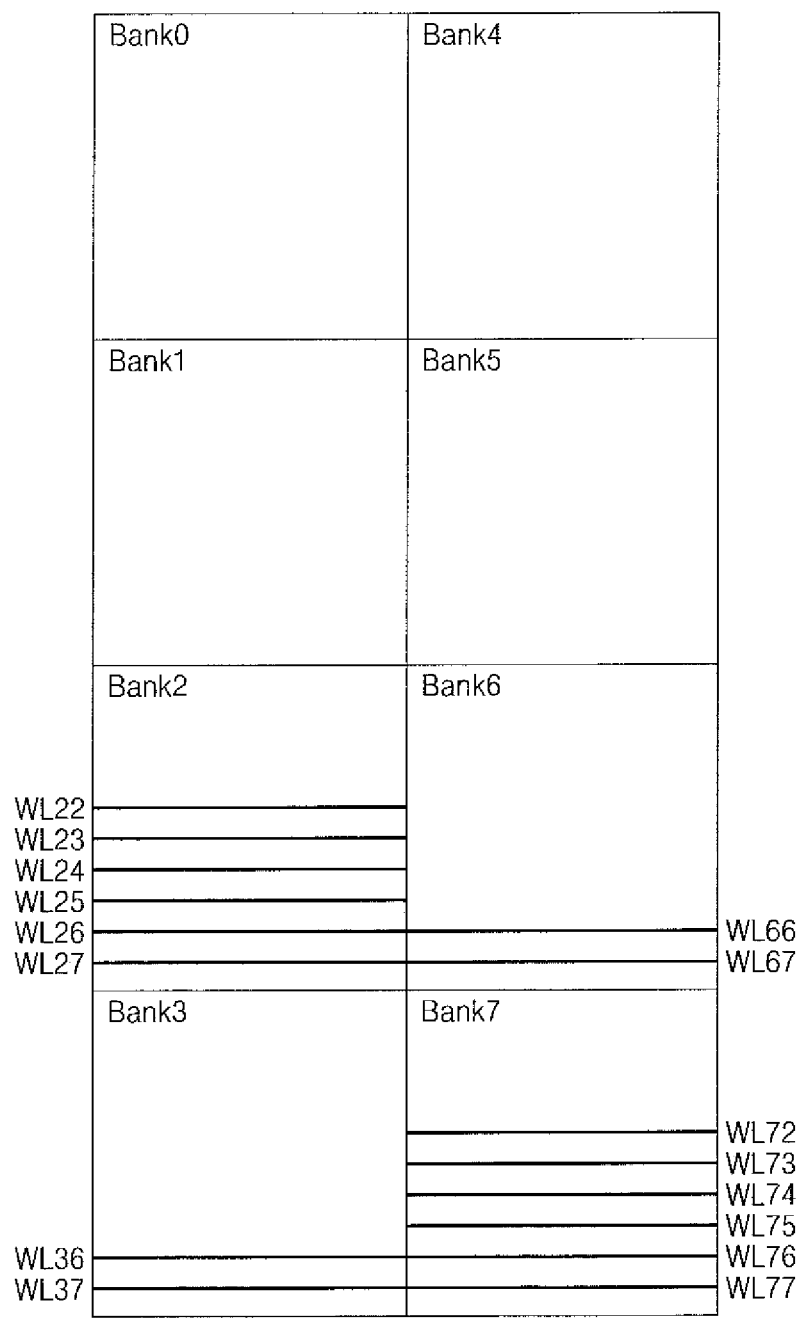
FIG. 7D illustrates a fourth refresh cycle of the plurality of banks illustrated in FIG. 7A, according to an exemplary embodiment of the present inventive concept.
Figure 8A:
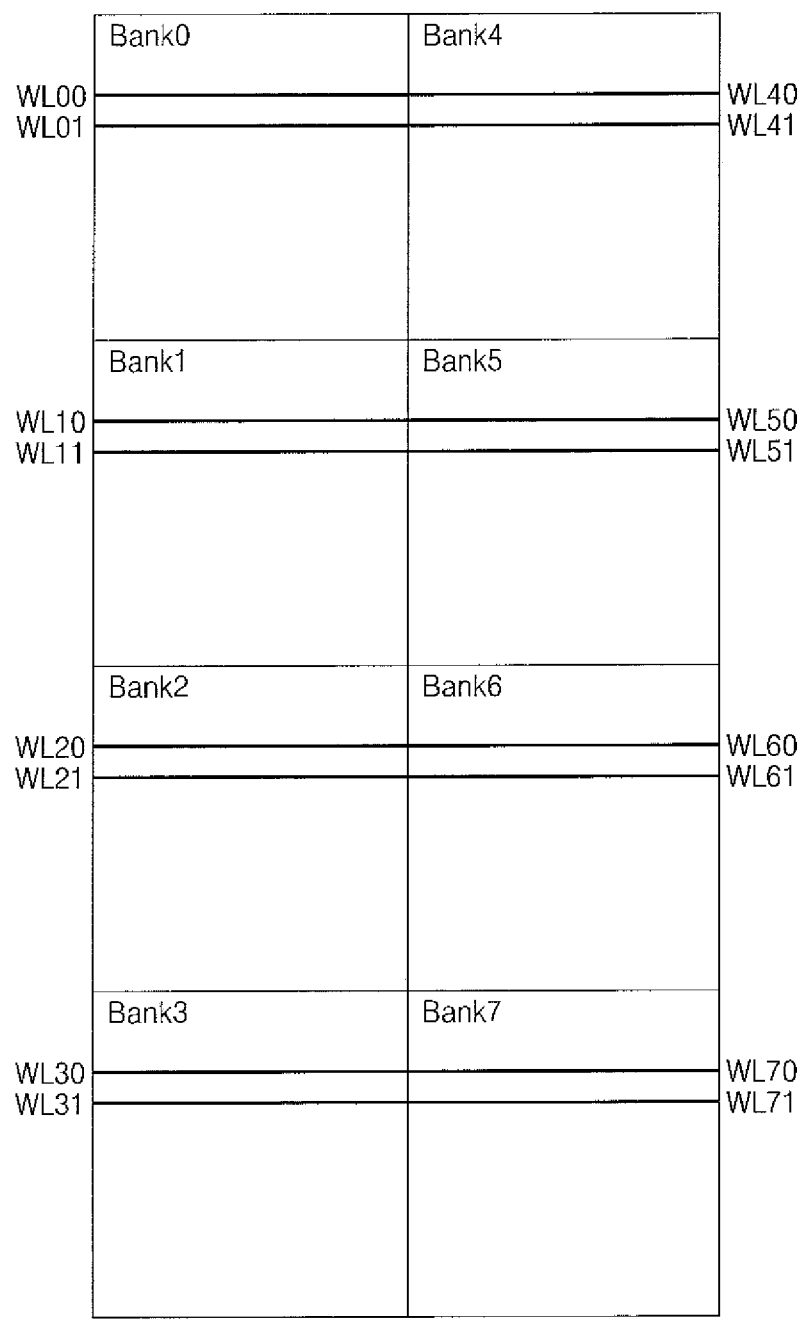
FIGS. 8A to 8D illustrate first through fourth refresh cycles of a refresh operation of a plurality of banks different from the refresh operation illustrated in FIGS. 7A through 7D, according to an exemplary embodiment of the present inventive concept.
Figure 8B:
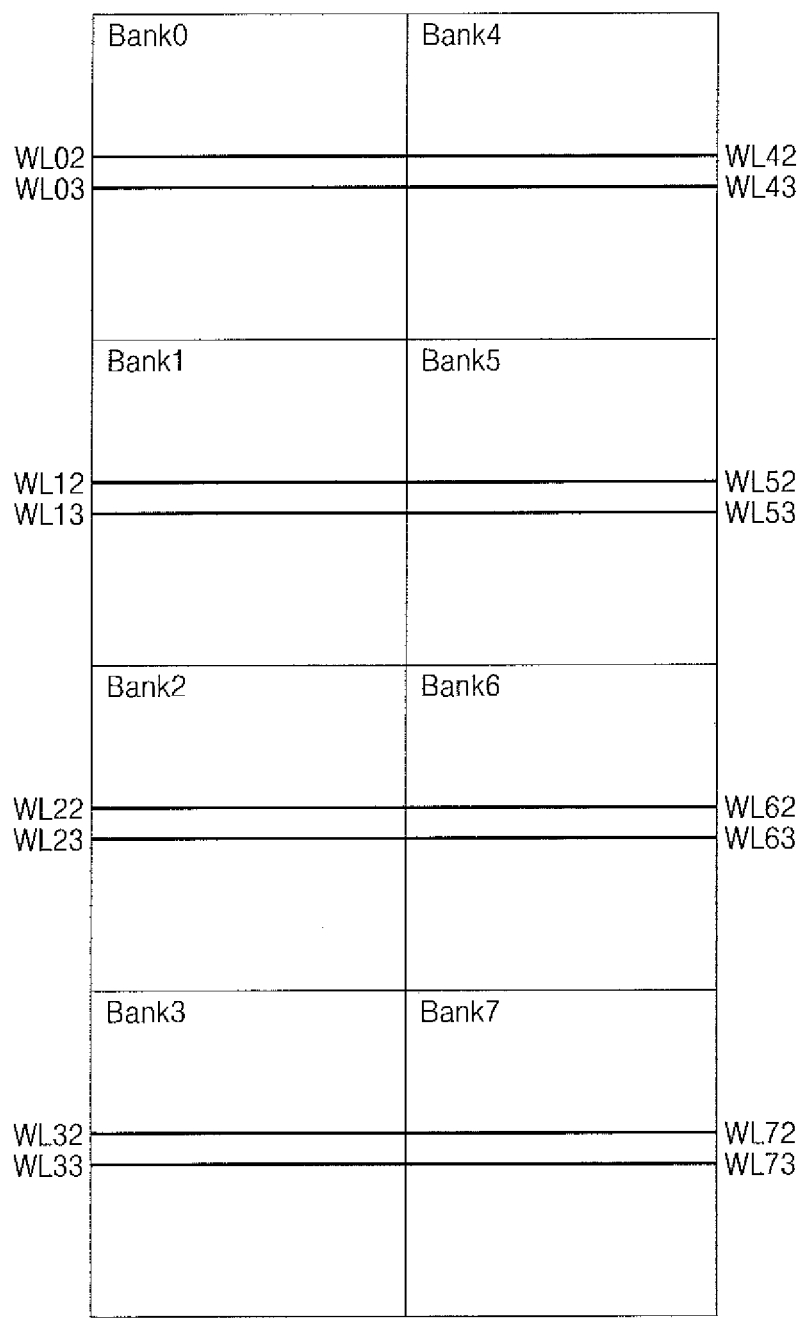
Figure 8C:
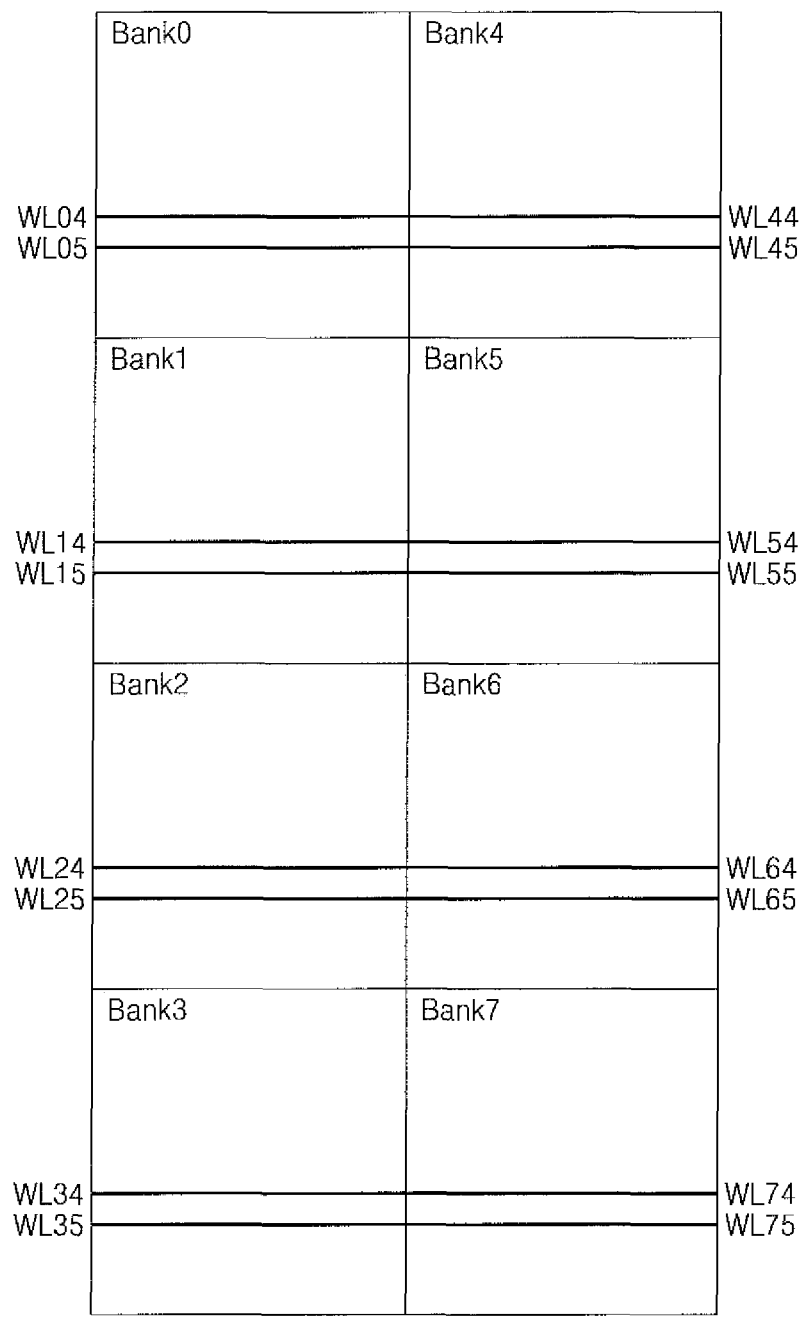
Figure 8D:
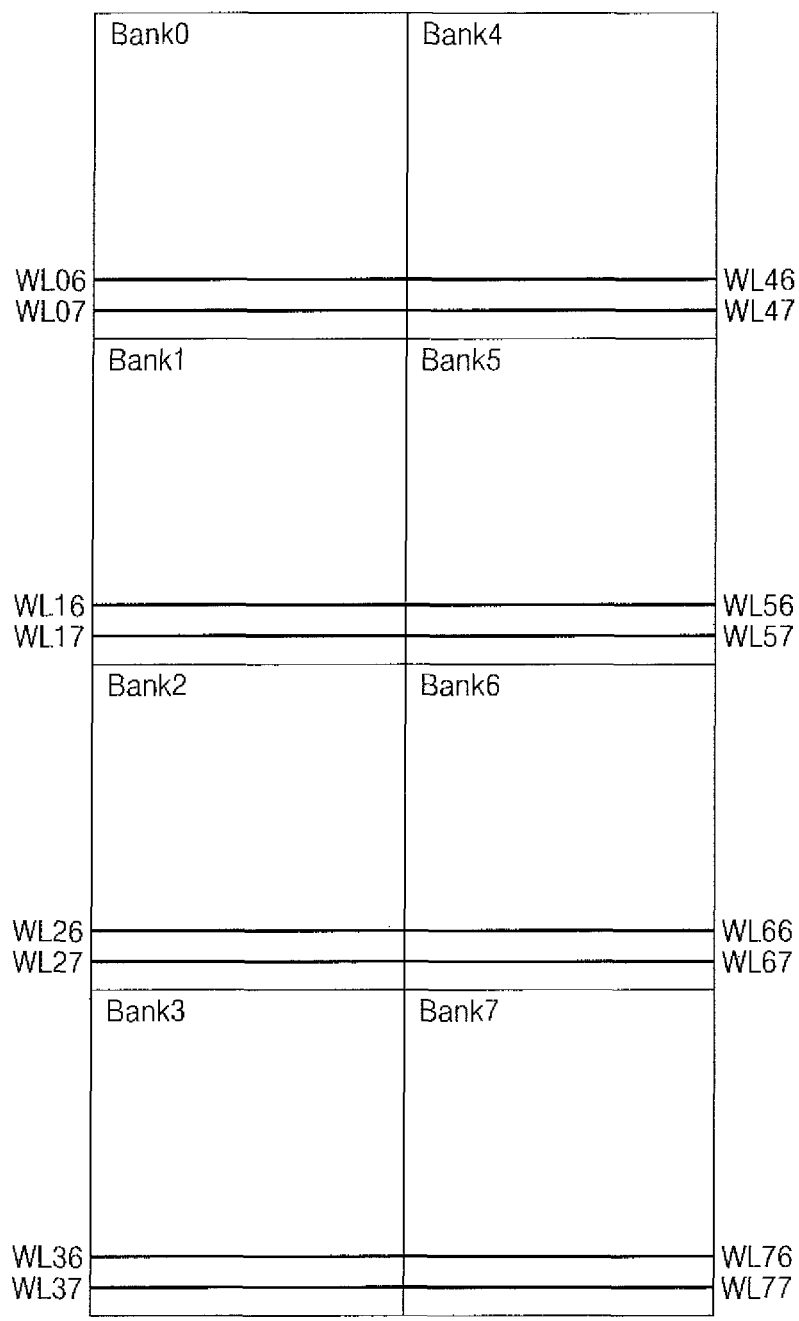

FIG. 7A illustrates a first refresh cycle of a refresh operation of the plurality of banks shown in FIG. 1 according to an exemplary embodiment. FIG. 7B illustrates a second refresh cycle of the plurality of banks illustrated in FIG. 7A. FIG. 7C illustrates a third refresh cycle of the plurality of banks illustrated in FIG. 7A. FIG. 7D illustrates a fourth refresh cycle of the plurality of banks illustrated in FIG. 7A.

In FIGS. 7A through 8D, the number of banks is eight, however, the number of banks is not limited thereto. Each of a plurality of banks 50' may include M word lines, where M is a natural number greater than or equal to two.

Referring to FIG. 7A, a refresh operation may be performed on selected banks Bank0, Bank1, Bank4 and Bank5 during a first refresh cycle. In this case, two word lines WL00 and WL01 included in bank Bank0, six word lines WL10 through WL15 included in bank Bank1, six word lines WL40 through WL45 included in bank Bank4, and two word lines WL50 and WL51 included in bank Bank5 may be activated. That is, a different number of word lines included in each of the selected banks may be activated.

Referring to FIG. 7B, a refresh operation may be performed on selected banks Bank0, Bank1, Bank4, and Bank5 during a second refresh cycle. Six word lines WL02 through WL07 included in bank Bank0, two word lines WL16 and WL17 included in bank Bank1, two word lines WL46 and WL47 included in bank Bank4, and six word lines WL52 through WL57 included in bank Bank5 may be activated during a second refresh cycle.

Referring to FIG. 7C, a refresh operation may be performed on selected banks Bank2, Bank3, Bank6, and Bank7 during a third refresh cycle. Two word lines WL20 and WL21 included in bank Bank2, six word lines WL30 through WL35 included in bank Bank3, six word lines WL60 through WL65 included in bank Bank6, and two word lines WL70 and WL71 included in bank Bank7 may be activated during a third refresh cycle.

Referring to FIG. 7D, a refresh operation may be performed on selected banks Bank2, Bank3, Bank6 and Bank7 during a fourth refresh cycle.

Six word lines WL22 through WL27 included in bank Bank2, two word lines WL36 and WL37 included in bank Bank3, two word lines WL66 and WL67 included in bank Bank6, and six word lines WL72 through WL77 included in bank Bank7 may be activated during a fourth refresh cycle. For example, when each of the plurality of banks 50' has 1,000 word lines (e.g., M=1,000), a total of 500 refresh cycles are required to perform a refresh operation on every word line included in each of the plurality of banks 50' during a refresh period. When a refresh cycle is 64 ms, a periodic refresh interval time is 128 µs.

FIGS. 8A through 8D illustrate first through fourth refresh cycles of a refresh operation of a plurality of banks different from the refresh operation illustrated in FIGS. 7A through 7D. Referring to FIGS. 8A through 8D, word lines included in each of banks Bank0 through Bank 7 may be activated by two successively during each refresh cycle.

For example, when each of the plurality of banks 50' has 1,000 word lines (e.g., M=1,000), a total of 500 refresh cycles are required to perform a refresh operation on every word line included in each of the plurality of banks 50' during a refresh period. When a refresh period is 64 ms, a periodic refresh interval time is 128 µs. That is, the memory device 100 according to an exemplary embodiment may retain a periodic refresh interval time (e.g., 128 µs), and also perform a normal memory access operation on unselected banks.

For example, when the memory device 100 has eight banks (e.g., N=8) including 1,000 word lines (e.g., M=1,000), and 500 refresh cycles are performed during a refresh period, a total of 16 word lines (e.g., M*N/L=1,000*8/500=16) may be activated at selected banks during a refresh cycle.

Figure 9A:
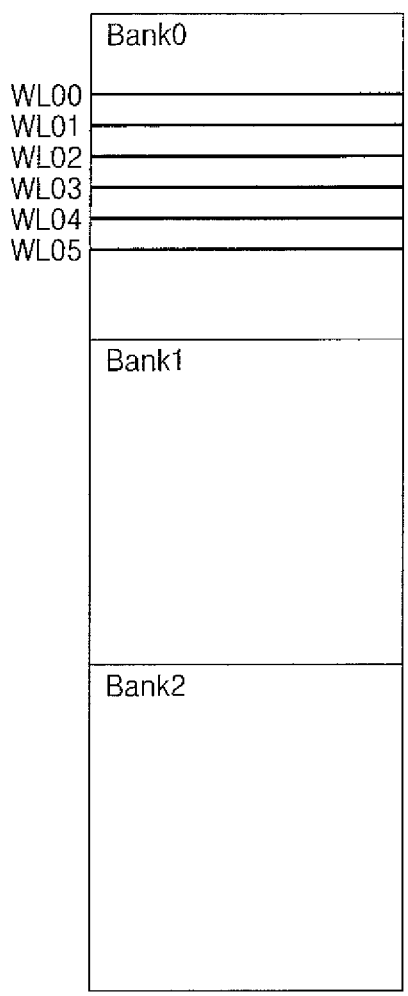
FIG. 9A illustrates a first refresh cycle of the refresh operation of the plurality of banks illustrated in FIG. 1, according to an exemplary embodiment of the present inventive concept.
Figure 9B:
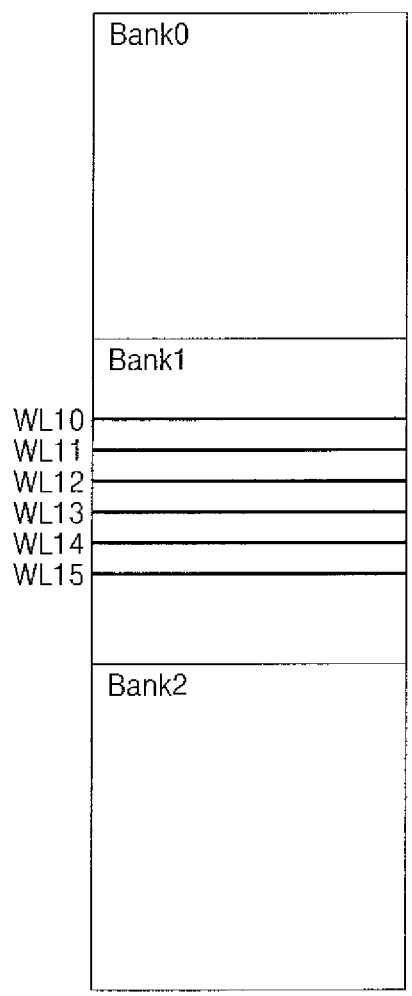
FIG. 9B illustrates a second refresh cycle of the plurality of banks illustrated in FIG. 9A, according to an exemplary embodiment of the present inventive concept.
Figure 9C:
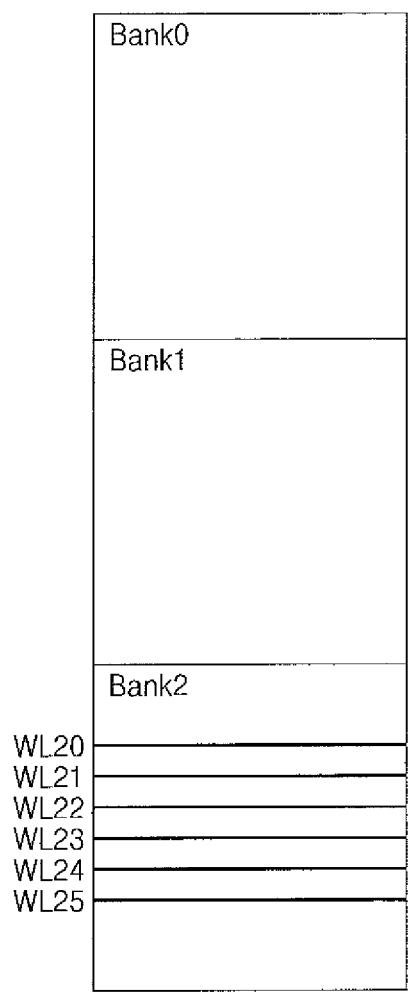
FIG. 9C illustrates a third refresh cycle of the plurality of banks illustrated in FIG. 9A, according to an exemplary embodiment of the present inventive concept.

FIG. 9A illustrates a first refresh cycle of a refresh operation of the plurality of banks illustrated in FIG. 1 according to an exemplary embodiment. FIG. 9B illustrates a second refresh cycle of the plurality of banks illustrated in FIG. 9A. FIG. 9C illustrates a third refresh cycle of the plurality of banks illustrated in FIG. 9A.

In FIGS. 9A through 9C, the number of banks is three, however, the number of banks is not limited thereto. Each of the plurality of banks 50' may include M word lines, where M is a natural number greater than or equal to two. Referring to FIGS. 9A through 9C, one of three banks 50" may be selected during each refresh cycle.

For example, when the memory device 100 has three banks (e.g., N=3), each including 1,000 word lines (e.g., M=1,000), and 500 refresh cycles (e.g., L=500) are performed during a refresh period, six word lines (M*N/L=1,000*3/500=6) may be activated at a selected bank (e.g., bank Bank0 of FIG. 9A, bank Bank1 of FIG. 9B, or bank Bank2 of FIG. 9C) during each refresh cycle.

Figure 10A:
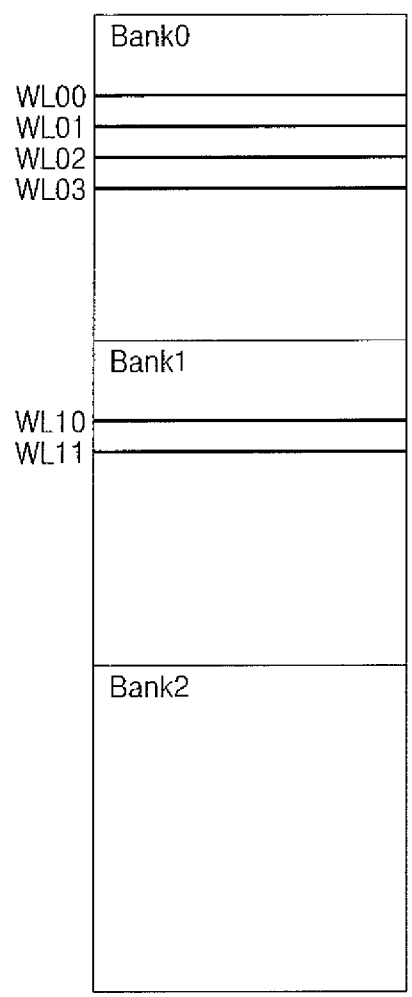
FIG. 10A illustrates a first refresh cycle of the refresh operation of the plurality of banks illustrated in FIG. 1, according to an exemplary embodiment of the present inventive concept.
Figure 10B:
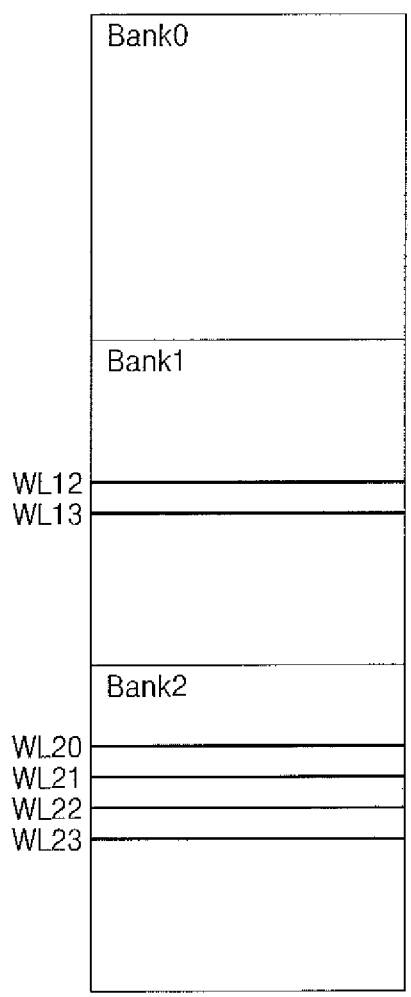
FIG. 10B illustrates a second refresh cycle of the plurality of banks illustrated in FIG. 10A, according to an exemplary embodiment of the present inventive concept.

FIG. 10A illustrates a first refresh cycle of a refresh operation of the plurality of banks illustrated in FIG. 1 according to an exemplary embodiment. FIG. 10B illustrates a second refresh cycle of the plurality of banks illustrated in FIG. 10A.

In FIGS. 10A through 10B, the number of banks is three, however the number of banks is not limited thereto.

Referring to FIG. 10A, a refresh operation may be performed on two banks Bank0 and Bank1 selected from among three banks 50" during a first refresh cycle. In this case, four word lines WL00 through WL03 included in bank Bank0 and two word lines WL10 and WL11 included in bank Bank1 may be activated.

Referring to FIG. 10B, a refresh operation may be performed on two banks Bank1 and Bank2 selected from among three banks 50" during a second refresh cycle. In this case, two word lines WL12 and WL13 included in bank Bank1 and four word lines WL20 through WL23 included in bank Bank2 may be activated.

For example, when the memory device 100 has three banks (e.g., N=3) including 1,000 word lines (e.g., M=1,000), and 500 refresh cycles (e.g., L=500) are performed during a refresh period, a total of six word lines (e.g., M*N/L=1, 000*3/500=6) may be activated at selected banks during a refresh cycle.

Figure 11:
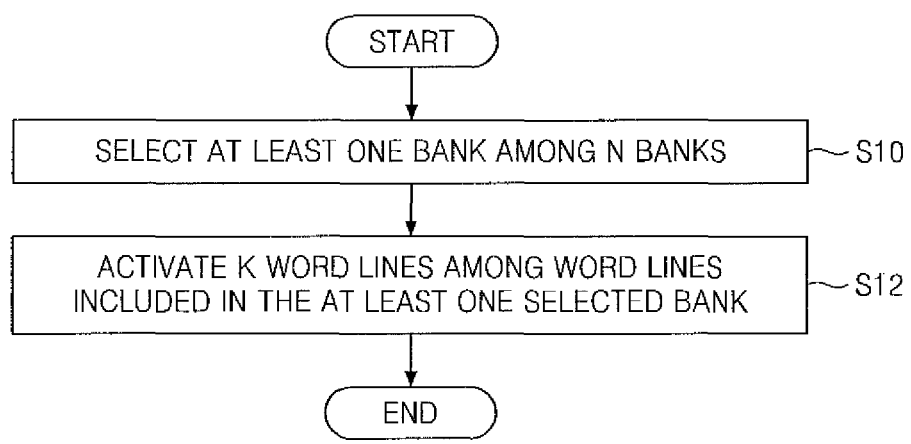
FIG. 11 is a flowchart illustrating a refresh operation method of a memory device, according to an exemplary embodiment of the present inventive conept.

FIG. 11 is a flowchart illustrating a refresh operation method of a memory device according to an exemplary embodiment of the present inventive concept. Referring to FIGS. 1 and 11, the memory device 100 may select at least one of N banks 50, which is a target of a refresh operation, based on a bank address signal BA (S10).

K word lines from among the word lines included in at least one selected bank may be activated during a refresh cycle (S 12). When the memory device 100 has N banks, where N is a natural number greater than or equal to two, each including M word lines, where M is a natural number greater than or equal to two, and L refresh cycles, where L is a natural number less than or equal to M, are performed during a refresh period, K may be equal to M*N/L.

Figure 12:
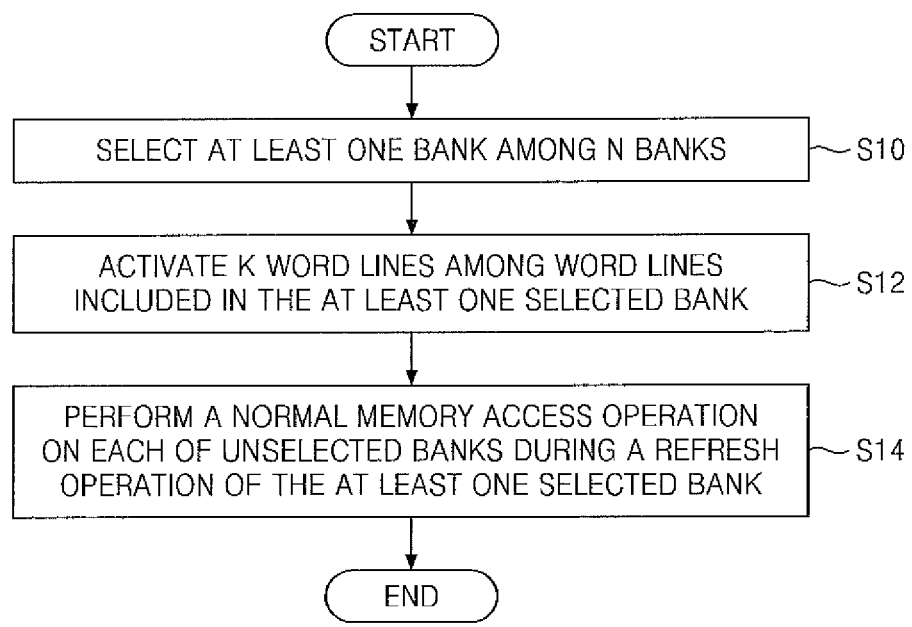
FIG. 12 is a flowchart illustrating a refresh operation method of a memory device, according to an exemplary embodiment of the present inventive concept.

FIG. 12 is a flowchart illustrating a refresh operation method of a memory device according to an exemplary embodiment of the present inventive concept. Referring to FIGS. 1 and 12, the memory device 100 may select at least one of N banks 50, which is a target of a refresh operation, based on a bank address signal BA (S10). K word lines from among the word lines included in at least one selected bank may be activated during a refresh cycle (S 12). The memory device 100 may perforin a normal memory access operation (e.g., a read operation or a write operation) on each of unselected banks among N banks 50 during a refresh operation of at least one selected bank (S14).

Figure 13:
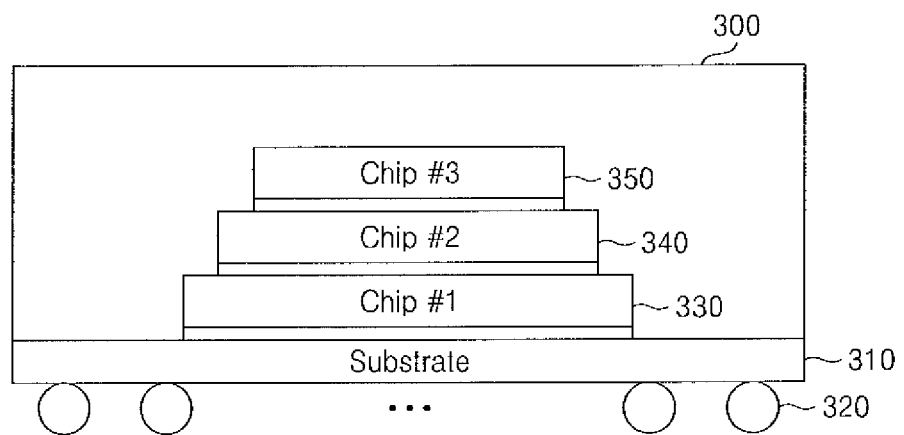
FIG. 13 is a diagram illustrating an exemplary embodiment of a package including the memory device illustrated in FIG. 1, according to an exemplary embodiment of the present inventive concept.

FIG. 13 is a diagram illustrating an exemplary embodiment of a package including the memory device illustrated in FIG. 1. Referring to FIGS. 1 and 13, a package 300 may include a plurality of semiconductor devices 330, 340 and 350 stacked successively on a package substrate 310. Each of the plurality of semiconductor devices 330 to 350 may be, for example, the memory device 100.

The package 300 may utilize a variety of different packaging technologies including, for example, Package On Package (PoP), Ball Grid Arrays (BGAs), Chip Scale Packages (CSPs), Plastic Leaded Chip Carrier (PLCC), Plastic Dual In-Line Package (PDIP), Chip On Board (COB), CERamic Dual In-Line Package (CERDIP), Plastic Metric Quad Flat Pack (MQFP), Thin Quad Flat Pack (TQFP), Small-Outline Integrated Circuit (SOIC), Shrink Small Outline Package (SSOP), Thin Small Outline (TSOP), System In Package (SIP), Multi Chip Package (MCP), Wafer-Level Package (WLP), or Wafer-Level Processed Stack Package (WSP). For example, in FIG. 13, the package 300 is a BGA package including solder balls 320.

According to an exemplary embodiment, a memory controller may be embodied inside more than one semiconductor device from among the plurality of semiconductor devices 330 to 350, or embodied on the package substrate 310.

An electrical vertical connection means (e.g., a through-silicon via (TSV)) may be used to maintain an electrical connection between the plurality of semiconductor devices 330 to 350.

In an exemplary embodiment, the package 300 may be embodied as a Hybrid Memory Cube (HMC) having a structure where a memory controller and a memory cell array die are stacked. When an HMC is utilized, performance of the memory device may be improved as a result of an increase in bandwidth, and power consumption and production cost may be reduced by minimizing an area occupied by the memory device.

Figure 14:
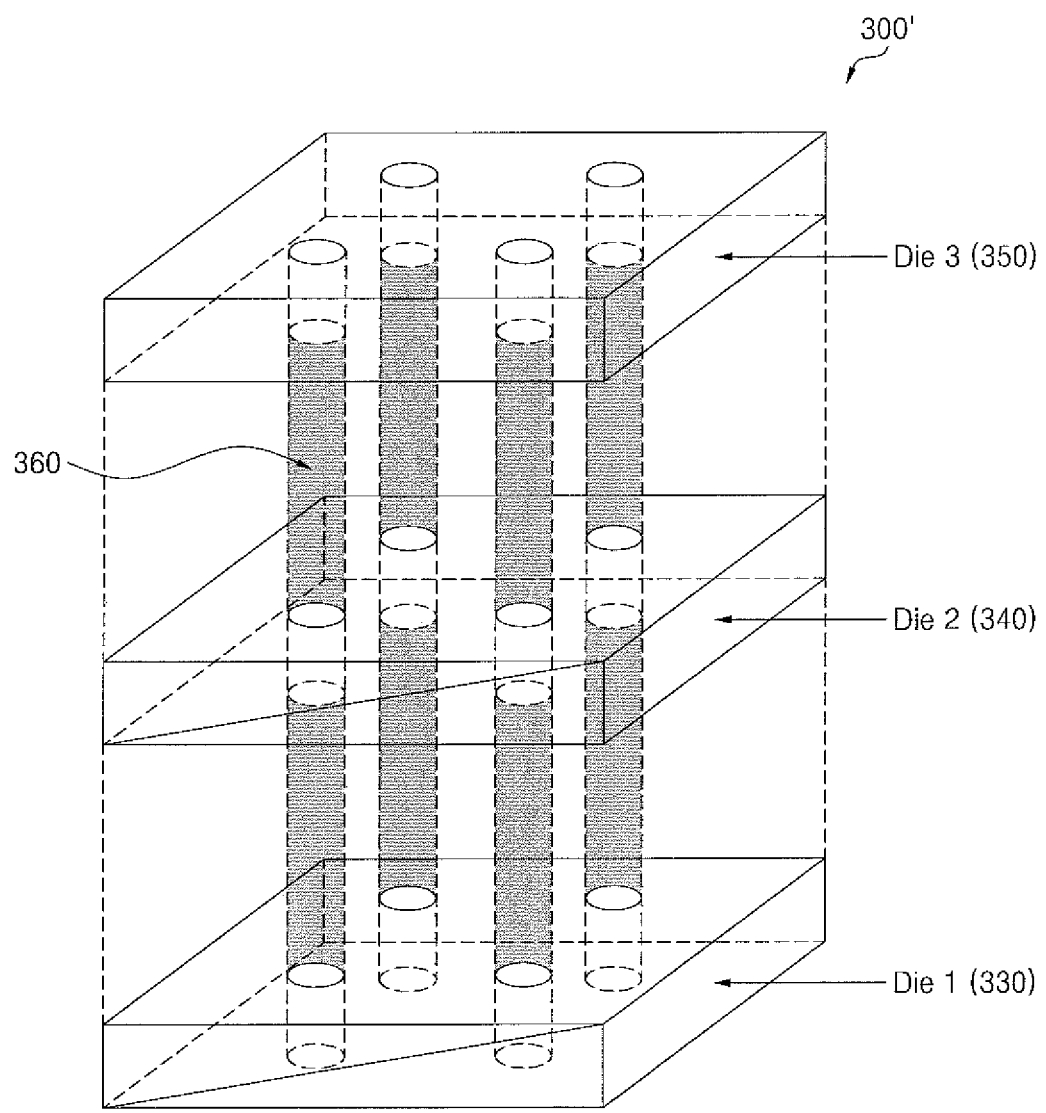
FIG. 14 is a diagram illustrating an exemplary embodiment of a package including the memory device illustrated in FIG. 1, according to an exemplary embodiment of the present inventive concept.

FIG. 14 is a diagram illustrating an exemplary embodiment of a package including the memory device illustrated in FIG. 1. Referring to FIGS. 1, 13 and 14, a package 300' includes a plurality of dies 330 to 350 having a stack structure where each die is connected to each other through each TSV 360.

Figure 15:
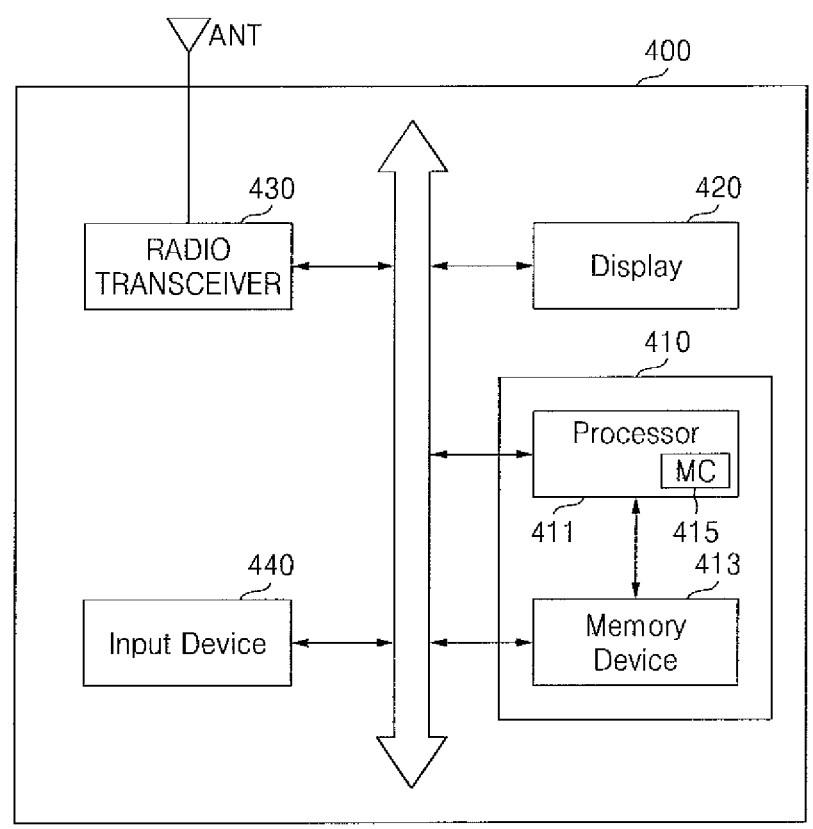
FIGS. 15 to 20 illustrate exemplary embodiments of a system including the memory device illustrated in FIG. 1.

FIG. 15 is an exemplary embodiment of a system including the memory device illustrated in FIG. 1. Referring to FIGS. 1 and 13 through 15, a system 400 may be embodied in an electronic device, including, for example, a portable device. The portable device may be, for example, a cellular phone, a smartphone or a tablet PC.

The system 400 includes a processor 411 and a memory device 413. The memory device 413 may be the memory device 100 of FIG. 1. According to an exemplary embodiment, the processor 411 and the memory device 413 may be packaged into a package 410. In this case, the package 410 may be mounted on a system board. The package 410 may be, for example, the package 300 illustrated in FIG. 13 or the package 300' illustrated in FIG. 14, however the package 410 is not limited thereto.

The processor 411 includes a memory controller 415 that may control a data processing operation (e.g., a write operation or a read operation) of the memory device 413. The memory controller 415 may be controlled by the processor 411 controlling an overall operation of the system 400. According to an exemplary embodiment, the memory controller 415 may be connected between the processor 411 and the memory device 413.

Data stored in the memory device 413 may be displayed through a display 420 under control of the processor 411.

A radio transceiver 430 may transmit or receive a radio signal through an antenna ANT. For example, the radio transceiver 430 may convert a radio signal received through the antenna ANT into a signal which may be processed by the processor 411. Accordingly, the processor 411 may process a signal output from the radio transceiver 430, store a processed signal in the memory device 413, and/or display a processed signal through the display 420. The radio transceiver 430 may convert a signal output from the processor 411 into a radio signal and output a converted radio signal through the antenna ANT.

An input device 440 is a device that may input a control signal for controlling an operation of the processor 411, or data to be processed by the processor 411. The input device 440 may include, for example, a pointing device such as a touch pad or a computer mouse, a keypad or a keyboard.

The processor 411 may control the display 420 such that data output from the memory device 413, a radio signal output from the radio transceiver 430, or data output from the input device 440 may be displayed through the display 420.

Figure 16:
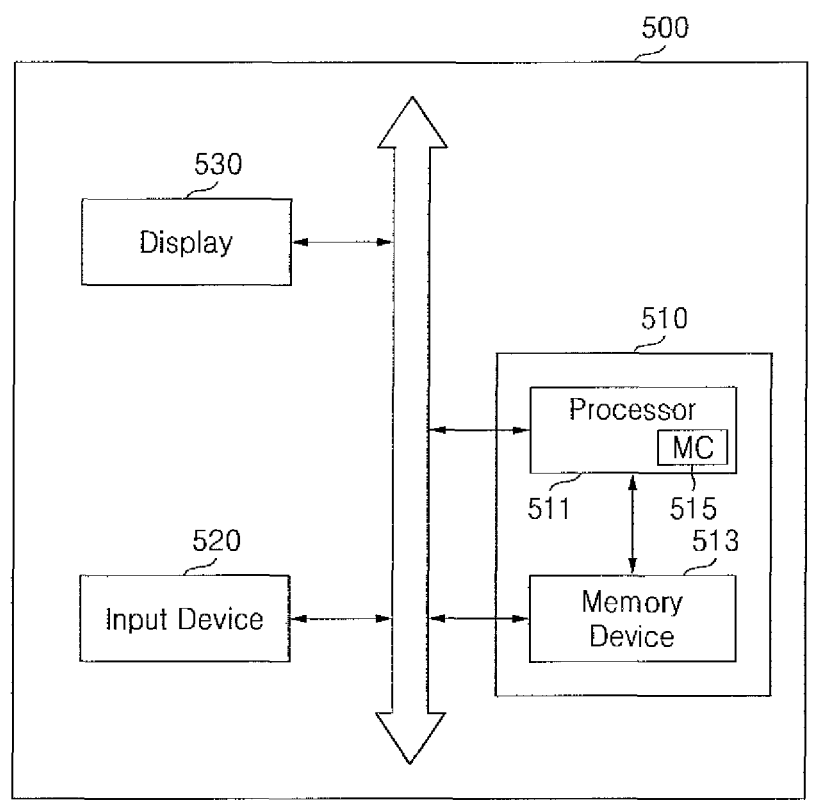

FIG. 16 is an exemplary embodiment of a system including the memory device illustrated in FIG. 1. Referring to FIGS. 1, 13, 14, and 16, a system 500 may include, for example, a personal computer (PC), a tablet PC, a netbook, an e-reader, a personal digital assistant (PDA), a portable multimedia player (PMP), an MP3 player, or an MP4 player.

The system 500 includes a processor 511 for controlling an overall operation of the system 500 and a memory device 513. The memory device 513 may be the memory device 100 illustrated in FIG. 1. According to an exemplary embodiment, the processor 511 and the memory device 513 may be packaged into a package 510. The package 510 may be mounted on a system board. The package 510 may be, for example, the package 300 illustrated in FIG. 13 or the package 300' illustrated in FIG. 14, however the package 510 is not limited thereto.

The processor 511 may include a memory controller 515 controlling an operation of the memory device 513. The processor 511 may display data stored in the memory device 513 through a display 530 according to an input signal received by an input device 520. The input device 520 may be, for example, a pointing device such as a touch pad or a computer mouse, a keypad or a keyboard.

Figure 17:
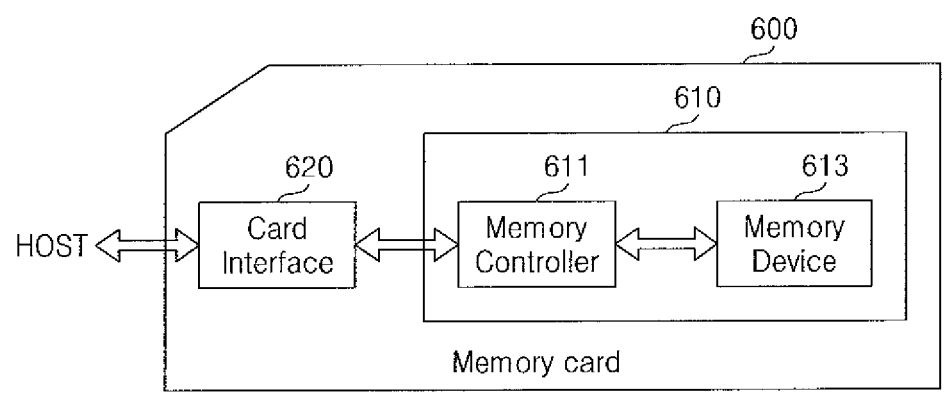

FIG. 17 is an exemplary embodiment of a system including the memory device illustrated in FIG. 1. Referring to FIGS. 1, 13, 14 and 17, a system 600 may be embodied as a memory card or a smart card.

The system 600 includes a memory device 613, a memory controller 611, and a card interface 610. The memory device 613 may be the memory device 100 illustrated in FIG. 1. According to an exemplary embodiment, the memory device 613 and the memory controller 611 may be packaged into a package 610. The package 610 may be mounted on a system board. The package 610 may be, for example, the package 300 illustrated in FIG. 13 or the package 300' illustrated in FIG. 14, however the package 610 is not limited thereto.

The memory controller 611 may control data exchange between the memory device 613 and a card interface 620. According to an exemplary embodiment, the card interface 620 may be a secure digital (SD) card interface or a multi-media card (MMC) interface, however, the card interface 620 is not limited thereto.

According to a protocol of a host, the card interface 620 may interface data exchange between the host and the memory controller 611.

When the system 600 is connected to a host such as, for example, a computer, a digital camera, a digital audio player, a cellular phone, console video game hardware or a digital set top box, the host may transmit or receive data stored in the memory device 613 through the card interface 620 and the memory controller 611.

Figure 18:
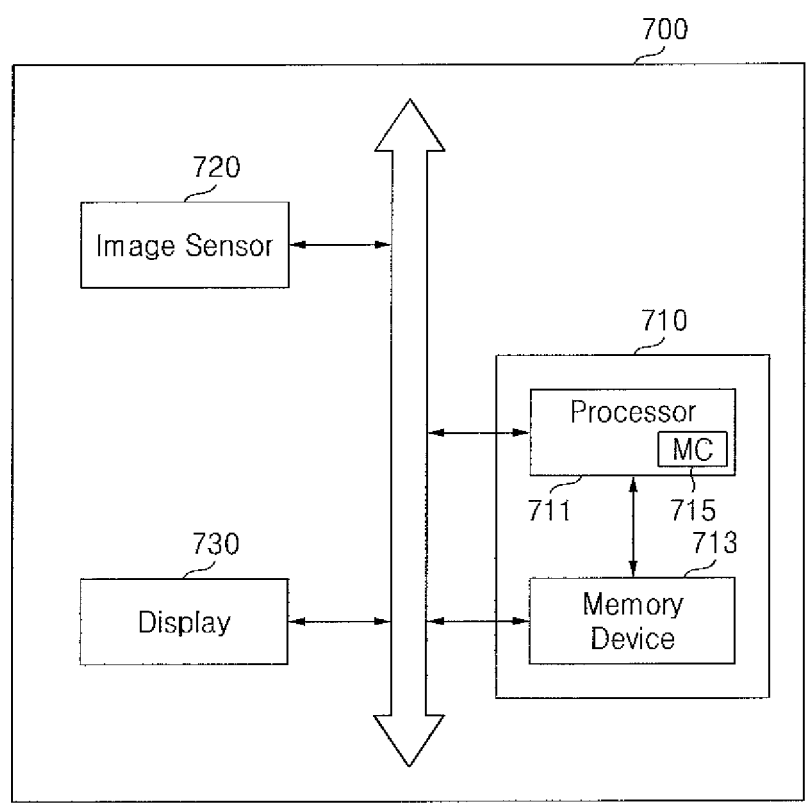

FIG. 18 is an exemplary embodiment of a system including the memory device illustrated in FIG. 1. Referring to FIGS. 1, 13, 14 and 18, a system 700 may be embodied as a digital camera or a portable device including an embedded digital camera.

The system 700 includes a processor 711 controlling an overall operation of the system 700, and a memory device 713. The processor may include a memory controller 715 that controls a data processing operation of the memory device 713. The memory device 713 may be the memory device 100 illustrated in FIG. 1. According to an exemplary embodiment, the processor 711 and the memory device 713 may be packaged into a package 710. The package 710 may be mounted on a system board. The package 710 may be, for example, the package 300 of FIG. 13 or the package 300' of FIG. 14, however the package 710 is not limited thereto.

An image sensor 720 of the system 700 converts an optical image into a digital signal, and a converted digital signal is stored in the memory device 713 or displayed through a display 730 under the control of the processor 711. A digital signal stored in the memory device 713 may be displayed through the display 730 under the control of the processor 711.

Figure 19:
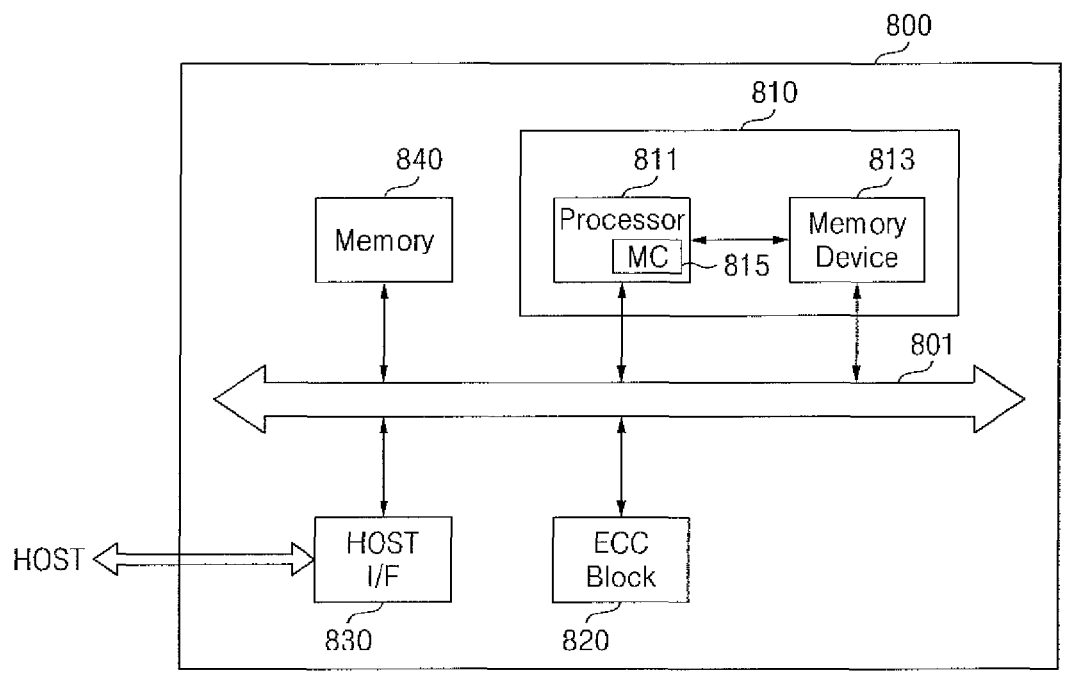

FIG. 19 is an exemplary embodiment of a system including the memory device illustrated in FIG. 1. Referring to FIGS. 1, 13, 14 and 19, a system 800 includes a memory device 813 and a processor 811 which may control an overall operation of the system 800. The memory device 813 may be the memory device 100 illustrated in FIG. 1.

According to an exemplary embodiment, the memory device 813 and the processor 811 may be packaged into a package 810. The package 810 may be mounted on a system board. The package 810 may be the package 300 of FIG. 13 or the package 300' of FIG. 14, however the package 810 is not limited thereto.

The processor 811 includes a memory controller 815 for controlling an operation of the memory device 813.

The system 800 includes a memory 840 which may be used as an operation memory of the processor 811. The memory 840 may be, for example, a non-volatile memory such as a read only memory (ROM) or a flash memory. A host connected to the system 800 may transmit or receive data to or from the memory device 813 through the processor 811 and a host interface 830. The memory controller 815 may perform a function of a memory interface. According to an exemplary embodiment, the system 800 may further include an error correction code (ECC) block 820.

The ECC block 820 operates under the control of the processor 811, and may detect and correct an error included in data read from the memory device 813 through the memory controller 815. The processor 811 may control data exchanged among the ECC block 820, the host interface 830 and the memory 840 through a bus 801.

The system 800 may be, for example, a Universal Serial Bus (USB) memory drive or a memory stick.

Figure 20:
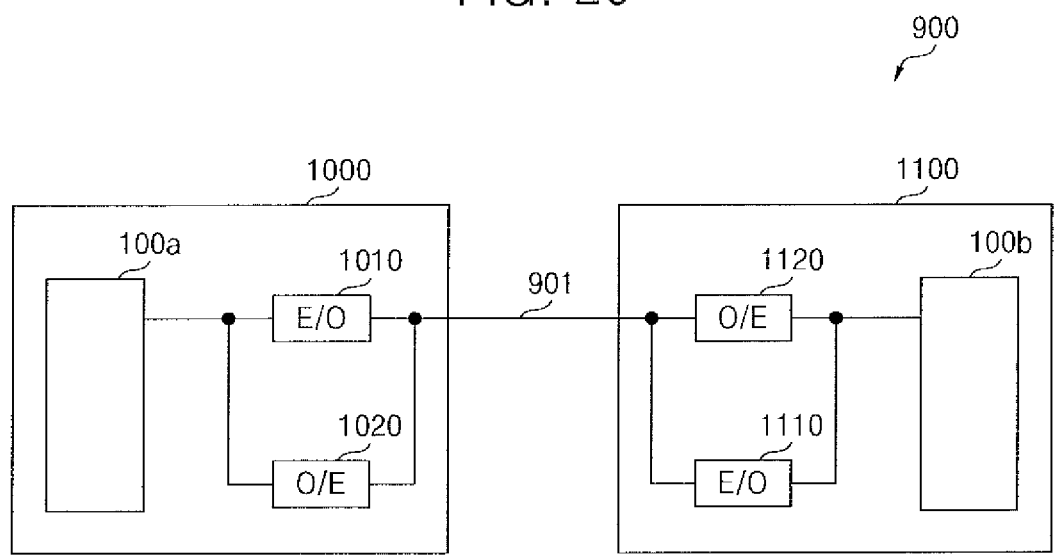

FIG. 20 is an exemplary embodiment of a system including the memory device illustrated in FIG. 1. A channel 901 may refer to, for example, an optical connection means. The optical connection means may be, for example, an optical fiber, an optical waveguide, or a medium transmitting an optical signal.

Referring to FIGS. 1 and 20, a system 900 may include a first system 1000 and a second system 1100. The first system 1000 may include a first memory device 100a and an electric-photo conversion circuit 1010. The electric-photo conversion circuit 1010 may convert an electric signal output from the first memory device 100a into an optical signal, and output a converted optical signal to the second system 1100 through an optical connection means 901.

The second system 1100 may include a photo-electric conversion circuit 1120 and a second memory device 100b. The photo-electric conversion circuit 1120 may convert an optical signal input through the optical connection means 901 into an electric signal, and transmit a converted electric signal to the second memory device 100b.

The first system 1000 may further include a photo-electric conversion circuit 1020, and the second system 1100 may further include an electric-photo conversion circuit 1110.

When the second system 1100 transmits data to the first system 1000, the electric-photo conversion circuit 1110 may convert an electric signal output from the second memory device 100b into an optical signal, and output a converted optical signal to the first system 1000 through the optical connection means 901. The photo-electric conversion circuit 1020 may convert an optical signal input through the optical connection means 901 into an electric signal, and transmit a converted electric signal to the first memory device 100a. The structure and operation of each memory device 100a and 100b may be substantially the same as the structure and operation of the memory device 100 of FIG. 1.

A method and an apparatus according to exemplary embodiments of the present inventive concept may avoid transmitting a large load to a memory controller by retaining a periodic refresh interval time and changing only an operation inside the memory device. Moreover, the method and the apparatus according to an exemplary embodiment of the present inventive concept may perform a normal memory access operation on unselected banks during a refresh operation by performing the refresh operation only on selected banks among a plurality of banks.

What is claimed is:

1. A memory refresh method, comprising:
   selecting at least one bank from among N banks of a memory device; and
   activating K word lines from among a plurality of word lines included in the at least one bank during one of L refresh cycles of a refresh period, wherein
   each of the N banks comprises M word lines,
   N, K and M are each a natural number greater than or equal to two,
   L is a natural number less than or equal to M, and
   K is equal to M*N/L.

2. The method of claim 1, wherein
   at least two banks from among the N banks are selected, and
   a different number of word lines included in each of the at least two banks are activated.

3. The method of claim 1, wherein
   at least two banks from among the N banks are selected, and
   a same number of word lines included in each of the at least two banks are activated.

4. The method of claim 1, further comprising:
   receiving an auto-refresh command,
   wherein the K word lines are activated in response to the auto-refresh command.

5. The method of claim 1, further comprising:
   refreshing K word lines from among word lines included in unselected banks from among the N banks.

6. The method of claim 1, wherein activating the K word lines comprises performing a normal memory access operation on each of unselected banks from among the N banks during the one of L refresh cycles.

7. The method of claim 1, wherein
   the N banks comprise a first bank, a second bank, a third bank, and a fourth bank,
   during a first refresh cycle of the L refresh cycles, a same number of word lines is activated in the first and second banks and no word lines are activated in the third and fourth banks, and
   during a second refresh cycle of the L refresh cycles, the same number of word lines is activated in the third and fourth banks and no word lines are activated in the first and second banks.

8. The method of claim 1, wherein
   the N banks comprise a first bank, a second bank, a third bank, a fourth bank, a fifth bank, a sixth bank, a seventh bank, and an eighth bank,
   during a first refresh cycle of the L refresh cycles, a first number of word lines is activated in the first and sixth banks, a second number of word lines, different from the first number of word lines, is activated in the second and fifth banks, and no word lines are activated in the third, fourth, seventh, and eighth banks,
   during a second refresh cycle of the L refresh cycles, the first number of word lines is activated in the second and fifth banks, the second number of word lines is activated in the first and sixth banks, and no word lines are activated in the third, fourth, seventh, and eighth banks,
   during a third refresh cycle of the L refresh cycles, the first number of word lines is activated in the third and eighth banks, the second number of word lines is activated in the fourth and seventh banks, and no word lines are activated in the first, second, fifth, and sixth banks, and
   during a fourth refresh cycle of the L refresh cycles, the first number of word lines is activated in the fourth and seventh banks, the second number of word lines is activated in the third and eighth banks, and no word lines are activated in the first, second, fifth, and sixth banks.

9. The method of claim 1, wherein
   the N banks comprise a first bank, a second bank, and a third bank,
   during a first refresh cycle of the L refresh cycles, a first number of word lines is activated in the first bank and no word lines are activated in the second and third banks,
   during a second refresh cycle of the L refresh cycles, the first number of word lines is activated in the second bank and no word lines are activated in the first and third banks, and
   during a third refresh cycle of the L refresh cycles, the first number of word lines is activated in the third bank and no word lines are activated in the first and second banks.

10. The method of claim 1, wherein
    the N banks comprise a first bank, a second bank, and a third bank,
    during a first refresh cycle of the L refresh cycles, a first number of word lines is activated in the first bank, a second number of word lines, different from the first number of word lines, is activated in the second bank, and no word lines are activated in the third bank, and
    during a second refresh cycle of the L refresh cycles, the first number of word lines is activated in the third bank, the second number of word lines is activated in the second bank, and no word lines are activated in the first bank.

11. A memory refresh method, comprising:
    selecting at least one bank from among a plurality of banks of a memory device;
    activating at least two word lines from among a plurality of word lines included in the at least one bank during one refresh cycle of a refresh period; and
    performing a normal memory access operation on each of a plurality of unselected banks from among the plurality of banks during a refresh operation of the at least one selected bank.

12. The method of claim 11, wherein the plurality of banks comprises N banks, the plurality of word lines comprises M word lines, the refresh period comprises L refresh cycles, and a number of word lines activated during the one refresh cycle is equal to M*N/L.

13. The method of claim 12, wherein
    at least two banks from among the N banks are selected, and
    a different number of word lines included in each of the at least two banks are activated.

14. The method of claim 12, wherein
    at least two banks from among the N banks are selected, and
    a same number of word lines included in each of the at least two banks are activated.

15. The method of claim 11, wherein the normal memory access operation comprises a read operation or a write operation.

16. A memory device, comprising:
   N banks, wherein each of the N banks comprises M word lines; and
   a control circuit configured to select at least one bank from among the N banks in response to a refresh command set, and activate K word lines from among a plurality of word lines included in the at least one bank during one of L refresh cycles of a refresh period, wherein
   N, K and M are each a natural number greater than or equal to two,
   L is a natural number less than or equal to M, and
   K is equal to M*N/L.

17. The memory device of claim 16, wherein the refresh command set comprises an auto-refresh command.

18. The memory device of claim 16, wherein the memory device is a dynamic random access memory (DRAM).

19. A memory system, comprising:
   the memory device of claim 16; and
   a memory controller configured to output the refresh command set.

20. The memory system of claim 19, wherein the refresh command set comprises an auto-refresh operation.

* * * * *